United States Patent [19]

Hayashi et al.

[11] Patent Number: 5,677,857

[45] Date of Patent: Oct. 14, 1997

[54] OPTIMUM DESIGN SYSTEM AND MANUFACTURING METHOD BY USE OF THE SYSTEM

[75] Inventors: Shigehiro Hayashi, Susono; Shoichi Kano, Toyota, both of Japan

[73] Assignee: Toyota Jidosha Kabushiki Kaisha, Aichi, Japan

[21] Appl. No.: 762,245

[22] Filed: Dec. 9, 1996

Related U.S. Application Data

[63] Continuation of Ser. No. 521,465, Aug. 30, 1995, abandoned, which is a continuation of Ser. No. 112,461, Aug. 27, 1993, abandoned.

[30] Foreign Application Priority Data

Sep. 8, 1992 [JP] Japan ................................ 4-238752

[51] Int. Cl.$^6$ .................................................. G06F 17/50
[52] U.S. Cl. ........................................... 364/578; 364/512

[56] References Cited

U.S. PATENT DOCUMENTS

| | | | |
|---|---|---|---|
| 5,016,185 | 5/1991 | Kuester et al. | 364/512 |
| 5,016,204 | 5/1991 | Simoudis et al. | 364/578 |
| 5,043,929 | 8/1991 | Kramer et al. | 364/578 |
| 5,163,015 | 11/1992 | Yokota | 364/512 |
| 5,257,200 | 10/1993 | Machala, III et al. | 364/578 |
| 5,265,028 | 11/1993 | Machala, III | 364/578 |
| 5,309,379 | 5/1994 | Rawlings et al. | 364/578 |
| 5,347,466 | 9/1994 | Nichols et al. | 364/578 |
| 5,349,541 | 9/1994 | Alexandro, Jr. et al. | 364/578 |

FOREIGN PATENT DOCUMENTS 3-224063  10/1991  Japan.

OTHER PUBLICATIONS

Scott D. Gray, et al., "Simplified Vehicle Mount Optimization Using Modal Parameters", *1990 JSAE Autumn Convention Proceedings 902* vol. 2, pp. 2.217–2.220.

Conte et al., "Elementary Numerical Analysis: An Algorithmic Approach", McGraw–Hill Book Company 1980.

*Primary Examiner*—Emanual T. Voeltz
*Assistant Examiner*—Eric W. Stamber
*Attorney, Agent, or Firm*—Oliff & Berridge

[57] ABSTRACT

Calculation of a mount for setting an engine to a vehicle body is carried out by a computer. The computer calculates the position, inclination, spring constant, and damping coefficient of the mount by an optimizing calculation according to the simplex method and judges whether a solution meets a restriction through the optimizing calculation. Then, if violation of the restriction is 1% or less, the computer changes the solution to an optimum solution meeting the restriction and continues the calculation. Thereby, the calculation can be carried out efficiently.

11 Claims, 6 Drawing Sheets

OPTIMUM DESIGN SYSTEM AND MANUFACTURING METHOD BY USE OF THE SYSTEM

This is a Continuation of application of Ser. No. 08/521, 465 filed Aug. 30, 1995, now abandoned, which is a continuation of application Ser. No. 08/112,461 filed Aug. 27, 1993, now abandoned.

BACKGROUND OF THE INVENTION

1. Field of the Invention

The present invention relates to an optimum design system for obtaining an optimum design value of a junction structure between elements by using an analysis model of a structure including a plurality of elements such as the setting of an engine on an automobile frame, etc.

2. Description of the Prior Art Heretofore, an optimum design using a computer has been utilized for the design of various structures. For the optimum design, a predetermined structure model is set and a proper initial value of design variables is given to the model. Then, responses obtained by giving various phenomena to the model are evaluated by a performance function and the design variables are successively changed so that the evaluation value approaches a predetermined value, and when the evaluation value approaches the predetermined value (in a usual case, when the performance function is sufficiently close to 0), the value of the design variable at this time is assumed as an optimum solution of design variables.

This optimum design system is used for the design of various structures including buildings, and is also used for the design of automobiles. To set an engine on an automobile frame, for example, vibration of the automobile depends largely on its setting method. Particularly, vibration of a cab depends largely on the position, hardness and the like of a mount (joining object) made of an elastic material which is interposed between the frame and engine. Therefore, if the mount can be designed by an optimizing design system using a computer, it is considered that the design time and the like can be remarkably decreased and a proper design can be achieved.

In this connection, an optimum design system using a computer is disclosed in the official gazette of Japanese Patent Application Laid-open No. 3-224083.

Therefore, the present inventors have designed a mount for setting an engine or the like on an automobile frame by an optimum design system using a computer. That is, they have determined design variables by using the position and hardness of an engine mount in an analysis model of the entire automobile as design variables and by doing the optimizing calculation of the design variables so that the vibration level is minimized.

However, when the optimizing calculation is actually done by the system, problems occur that the optimum solution of the design variables during the optimizing calculation violates a restriction and, if the calculation is repeatedly continued, the solution diverges. This is because restrictions for the number of significant digits are always present through the optimizing calculation. The optimizing calculation is carried out by means of double precision and errors due to the restrictions necessarily occur. This problem can be solved by using a high-speed large computer free from influences of the number of significant digits. However, to complete the calculation in a realistic processing time with a normal computer, the above problem cannot be avoided.

SUMMARY OF THE INVENTION

The present invention is made to solve the above problem and its object is to provide an optimizing design system for minimizing the divergence of a solution due to violation of restrictions on the optimizing calculation.

Moreover, it is another object of the present invention to provide a method for manufacturing a product using the optimum design.

The present invention is an optimum design system for obtaining an optimum solution of design variables of a junction structure between elements by using an analysis model of a structure comprising a plurality of elements, comprising eigenvalue analyzing means for setting design variables of the junction structure to predetermined values and calculating an eigenvalue and eigenvestor of the junction structure for a predetermined phenomenon, response calculating means for calculating a response of the analysis model for the predetermined phenomenon by using the eigenvalue and eigenvector, sensitivity calculating means for calculating the sensitivity of the calculated response to each design variable, optimum solution calculating means for calculating an optimum solution of the design variables for making the response of the analysis model desirable, restriction checking means for checking if the obtained optimum solution meets the restriction for calculation of the optimum solution, optimum solution changing means for changing the optimum solution to a solution meeting the restriction when a judgment result by the restriction checking means shows a violation of the restriction and the violation state remains in a predetermined small range, and means for updating the design values for the eigenvalue analyzing means; wherein operation is repeated by updating the design values until the calculated response obtained by the response calculating means approaches a predetermined value to obtain the optimum solution of the design variables.

Thus, for the predetermined small-range violation of the restriction, the optimum solution is changed to a solution meeting the restriction by the optimum solution changing means. This processing makes it possible to efficiently prevent the solution from diverging without affecting the accuracy of the optimum solution.

Moreover, it is preferable to obtain an optimum solution of "y=x−BL" with the optimum solution calculating means by assuming the lower limit of the fluctuation latitude of a design variable "x" as BL and the upper limit of it as BU and judge a case in which "y" is larger than "BU−BL" as a violation of a restriction with the optimum solution changing means.

Furthermore, when the restriction violation state remains in a predetermined small range, it is preferable to change the range to "y=BU−BL" or "x=BU".

In this case, it is preferable to set the predetermined small range so that the value of {y−(BU−BL)}/(BU−BL) comes 1% or less.

Furthermore, the present invention is characterized in that the sensitivity calculating means analytically calculates the sensitivity of each design variable by solving a differential equation obtained by differentiating a relational expression of eigenvalue and eigenvector based on an equation of motion of a free vibration system with each design variable.

Thus, it is possible to calculate an accurate sensitivity at a high speed because the sensitivity of each design variable is analytically calculated.

Moreover, it is possible to efficiently manufacture a product comprising a plurality of parts by the junction structure thus determined.

DESCRIPTION OF THE PREFERRED EMBODIMENT

Figure 1:
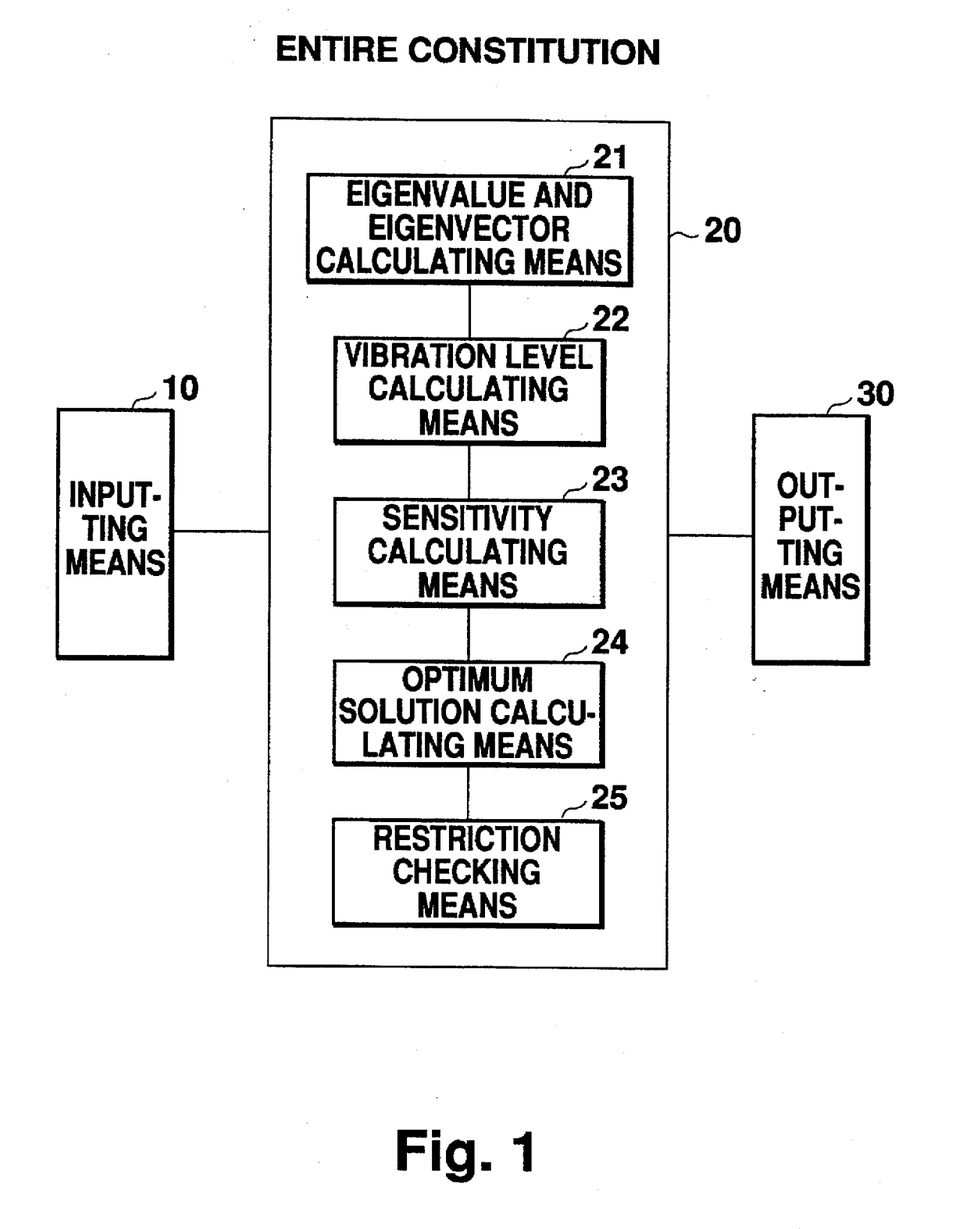
FIG. 1 is a block diagram showing the entire constitution of the system of the present invention.

Now, an embodiment of the present invention will be described below with reference to the attached drawings. FIG. 1 shows the entire constitution of the embodiment comprising inputting means 10 having a keyboard, FDD, and modem for inputting data and programs, an operating section 20 for carrying out various processings on the data including a CPU, ROM, or RAM, and outputting means 30 having a display and printer for outputting processing results.

The operating means 20 comprises eigenvalue and eigenvector calculating means 21 for calculating an eigenvalue and eigenvector for specifying the motional relationship between elements due to a phenomenon with a mount made of an elastic material joining the elements, vibration level calculating means 22 for calculating the level of the motion (vibration) of the entire vehicle (analysis model) in which an engine or the like is set on a frame through a mount, sensitivity calculating means 23 for calculating the response sensitivity of the vibration level when changing a design variable such as the elastic modulus of the mount or the like, optimum solution calculating means 24 for obtaining a numerical solution of a design variable for minimizing vibration from the sensitivity, and restriction checking means 25 for checking if an optimum solution meets the restriction for calculating the optimum solution.

Figure 2:
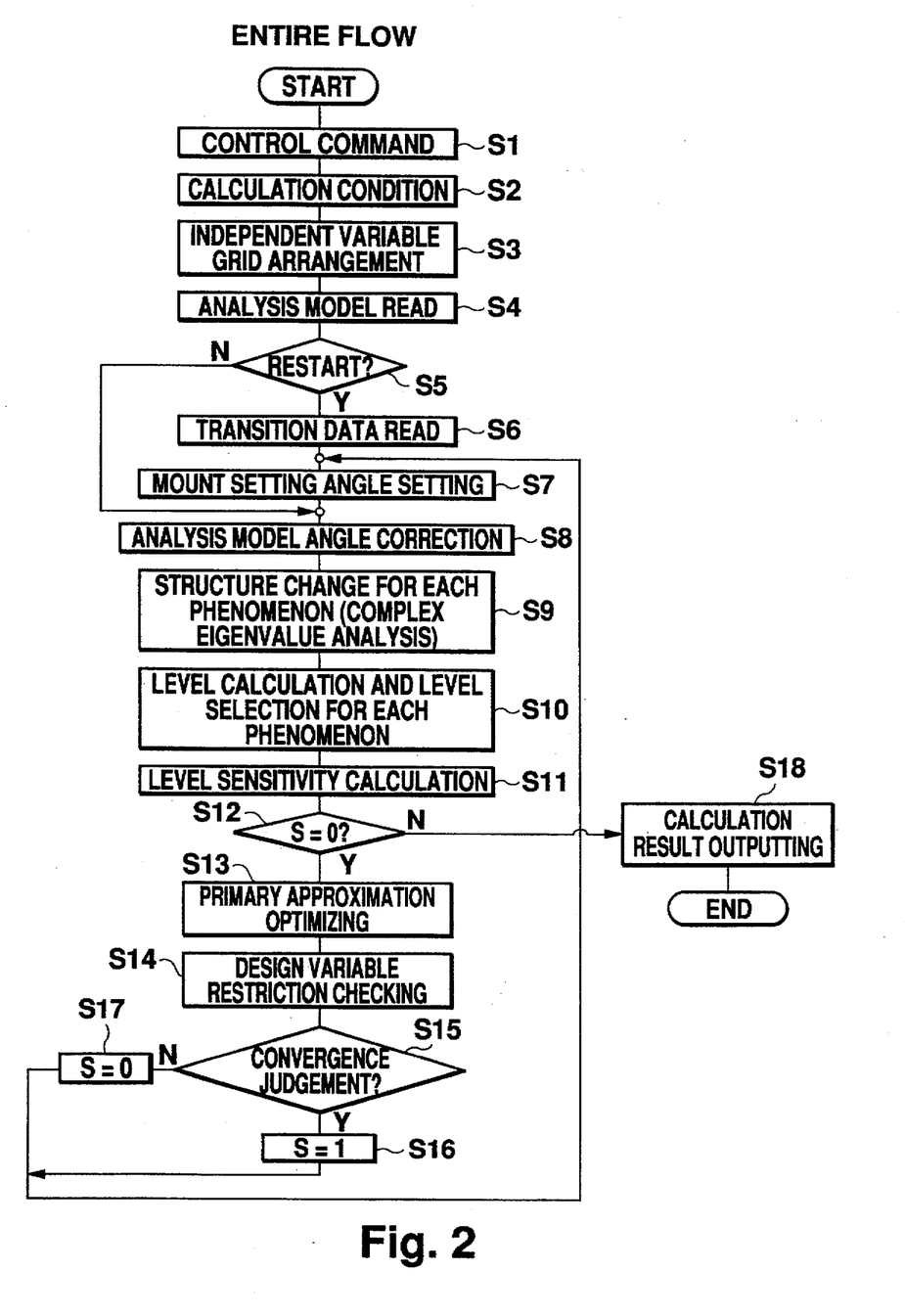
FIG. 2 is a flow chart showing operations of an embodiment of the present invention.

For the above equipment, design of a mount for setting an engine, differential gear unit, and exhaust pipe on a body is described by referring to FIG. 2. For this example, spring constant, damping coefficient, and inclination and position of main axis are used as mount design variables to determine an optimum value of these four design variables.

S1

First, various commands are read to control a program. In this case, a default value is set to each command. Therefore, unless another value is inputted, the default value is set. The following nine control commands are set.

(a) Restart recognition argument

This shows whether to continue the optimizing calculation by using already calculated results.

(b) Move limit reduction ratio

This shows the enlargement and reduction ratios of the fluctuation range (move limit) of each design variable.

(c) Maximum repetition of calculation

The repetition is used to set the maximum repetition of the optimizing calculation. By setting this coefficient when it takes a lot of time for an optimum solution to converge, calculation is interrupted at the maximum repetition and already calculated results are outputted. After the optimizing calculation is interrupted, it can be restarted by setting "restart" with the restart recognition argument.

(d) Number of analysis models

This embodiment uses a plurality of analysis models. That is, it uses analysis models not only for body vibration during idling but for vibration of a body caused by engine resonance due to road surface state while a vehicle runs (engine shake), drivability under acceleration or deceleration, and maneuvering stability. Because these analysis models use different frequency bands, it is necessary to set an analysis model for expressing each phenomenon.

(e) Number of phenomena to be analyzed

This shows the number of phenomena including idling vibration, engine shake, drivability, and maneuvering stability to be analyzed.

(f) Number of optimum model outputs

The number of outputs basically corresponds to the number of analysis models and a model obtained through the optimizing calculation for each analysis model is outputted.

(g) Analysis model storing file

This is a command for showing the name of a file for storing analysis models.

(h) Optimum model storing file

This is a command for the name of a file for storing optimizing models obtained through the optimizing calculation.

(i) Optimizing calculation result outputting file

This is a command for the name of a file for outputting the results of various variables of a mount obtained through the optimizing calculation. The calculation results include not only mount data but sensitivity, performance, and transition data for each phenomenon. The transition data is defined as the data for intermediate output before convergence.

S2

When values for control commands are thus set, calculation conditions are inputted (S2). Also for the calculation conditions, default values are also set. Unless the initial value is present between the upper and lower limits, a warning message is outputted to end the operation. The following eleven calculation conditions are inputted here.

(a) Upper and lower limits for initial value and fluctuation range of mount design variables As described above, there are the following four mount design variables: position, inclination, spring constant, and damping coefficient. In addition to the above, the initial value and fluctuation range of the frequency characteristic and displacement characteristic to be determined according to a phenomenon to be analyzed are also determined by this command.

(b) Setting objects of mount

For an engine, for example, a body (including a subframe for setting the engine) and the engine are set through a mount. Therefore, the engine and body are the setting objects.

(c) Initial value and upper and lower limits for move limit of each design variable These are conditions for determining the initial value and fluctuation range of each design variable in the optimizing calculation.

(d) Designation of fixed design variables

Because there are some design variables which do not change depending on the phenomenon, they are designated to efficiently achieve the optimizing calculation. For example, the mount setting position may not be changeable.

(e) Designation of design variables with a constant ratio between them

For example, there may be a predetermined relationship between spring constant and damping coefficient depending on the material constituting a mount. In this case, the ratio is designated to decrease the number of variables for efficient optimizing calculation.

(f) Designation of design variables with ratio or sum kept at a certain range and designation of upper and lower limits of the range When the mount setting position is symmetric to right and left, a certain relationship occurs on the inclination and position. Therefore, they are previously designated to efficiently achieve calculation.

(g) Grouping of grids for every setting object

Optimization of this embodiment changes the mount setting position not continuously but discretely. In other words, it discontinuously changes the setting position for every grid (intersection of grids at a predetermined interval) and groups these grids for every setting object.

(h) Designation of analysis phenomena

This is a designation of a response of a phenomenon to be analyzed. For idling vibration, for example, an analysis phenomenon is the vibration of a body floor (steering) due to engine vibration. For this embodiment, inputs to a model include grid, direction, magnitude, and time constant and responses include grid, direction, frequency range, and response-level dimensions (acceleration, displacement, angle, and transmission force). Thus, the behavior of a vehicle for a phenomenon to be analyzed is designated.

Figure 5:
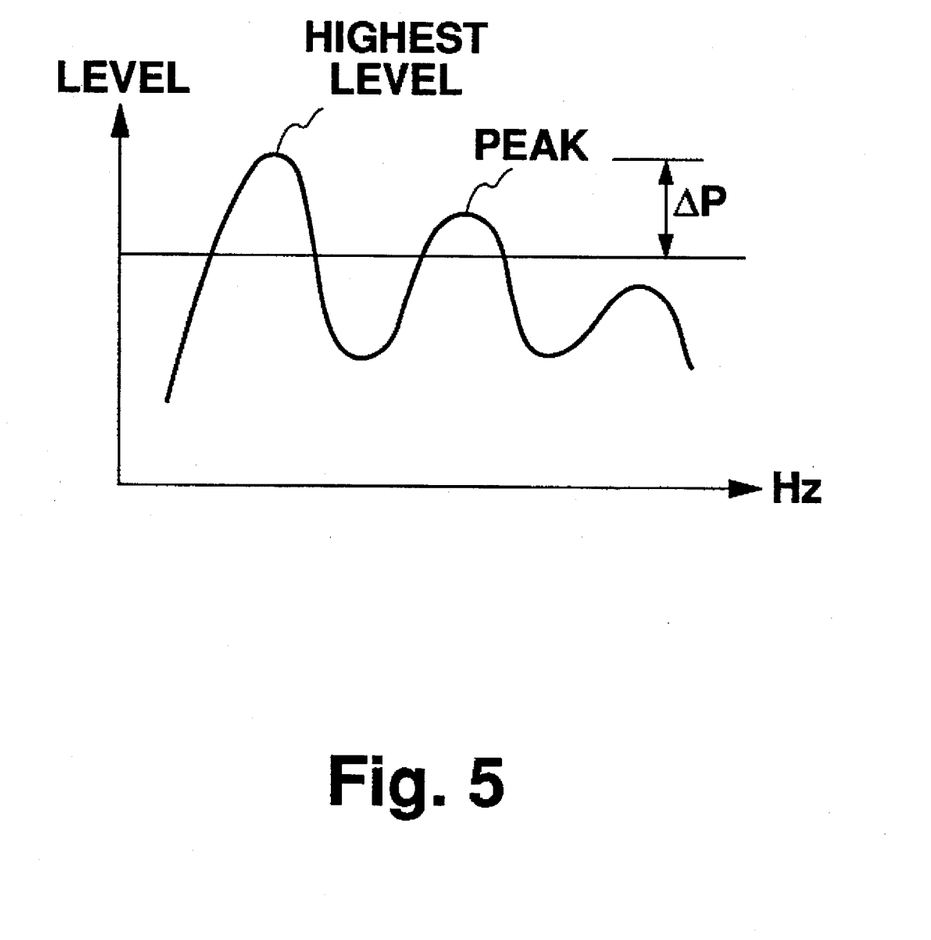
FIG. 5 is an illustration for explaining peak selection.

(i) Designation of objective function (response point of analysis phenomenon) and designation of ideal level, target level, and selection level The objective function is a designation of a phenomenon to be analyzed. For vibration under idling, for example, vibration of a vehicle floor is designated as a response point. The convergence point of objective functions is determined by the ideal and target levels. The selection level is a level showing a criterion for selection of the peak of a level obtained through level calculation for each phenomenon. That is, the peak in the range of $\Delta P$ in FIG. 5 is recognized as an objective function.

(j) Designation of restrictive function (response point of analysis phenomenon) and designation of upper- and lower-limit levels and selection level These are designations of functions for specifying the restriction of each objective function in the optimizing calculation. That is, when each objective function is specified as described above, a restriction for the practice of the optimizing calculation occurs in compliance with the function. Therefore, a restrictive function for specifying the restriction, upper- and lower-limit levels, and selection level are designated. The selection level is the same as that in the above Item (i).

(k) Designation of standard width for selection of objective and restrictive functions The peak of each vibration level is picked up according to the selection levels of the objective and restrictive functions set in the above Items (i) and (j) and a dissatisfaction degree is calculated. In this case, there are some dissatisfaction degrees which are not very large compared with the highest dissatisfaction peak though they are at the dissatisfaction side. However, if the optimizing calculation is applied to even these insignificant peaks, a lot of memory and CPU time is necessary. Therefore, it is necessary to exclude them from objective and restrictive functions in order to efficiently carry out the calculation. Thus, peaks lower than the level of the most dissatisfactory peak by a predetermined value ($\Delta T$) or more are excluded.

The standard width for selection represents the "width of dissatisfaction degree" $\Delta T$ used to exclude the peaks. That is, decrease of peaks according to the above selection level (according to $\Delta P$) is made for each phenomenon such as idling vibration and decrease of peaks according to the standard width for selection is done by assuming that all phenomena have the same significance.

S3

Then, design variables are selected to set an independent variable and a grid to be used for actual calculation is selected. That is, the design variable to which the ratio read in the above S2 (e) is specified is selected as a group variable and a design variable representing a group is defined for the group variable. Then, an independent design variable is set by including the design variable representing the group and variables not belonging to the group. The optimizing calculation is applied only to the independent variable.

Moreover, the upper and lower limits of the representative design variable are set according to the upper and lower limits of the group variable. The upper and lower limits use the severest ones among those of variables belonging to the group. Furthermore, the upper and lower limits of the independent design variable and the initial value and upper and lower limits of the move limit are set by including variables not belonging to the group. If the initial value is out of the upper and lower limits, a warning message is outputted to end the operation.

Moreover, a grid to be used for calculation is selected, and a grid is newly prepared. Its grid number and coordinate value are held (a and b in FIG. 4). As the coordinate value, the initial value of the design variable is used. If the subsequent calculation is not smoothly carried out, a warning message is outputted to end the operation.

S4

Next, an analysis model is read. That is, the following modal parameters are read: eigenvalue, eigenvector, mode damping ratio, mode rigidity, modal mass (weight), and grid coordinates of the elements including a body and engine. This analysis model is previously obtained from the shape and material of the body. When the grid used for calculation is not included in the model, a warning message is outputted to end the operation. Moreover, the eigenvector of the grid used for the calculation is held at a point other than the mount setting point.

The analysis model can be expressed in the form of the linear viscous damping type or general viscous damping type. The former is written in a file according to the n-format because conditions are limited and the latter is written in the file according to the 2n-format because conditions are not limited. In this case, the file is read by automatically judging the n- or 2n-format. Therefore, the modal parameters are of the n- or 2n-mode.

S5

Then, it is judged by the argument read in the above S1 (a) whether the calculation is restarted or not.

S6

When the calculation is restarted, transition data is read. That is, already calculated results are read and the optimizing processing is continuously carried out. Therefore, the transition data includes the following.

(a) Total number of repetitive steps (b) Number of independent variables (c) Number of mounts using angle as design variable (d) Total number of grids used for calculation (e) Number of response points for each repetitive step, level and peak frequency of objective function, and level and peak frequency of restrictive function (f) Value of independent variable and that of move limit for each repetitive step (g) Mount setting angle (Direction cosine)

S7

Figure 3A:
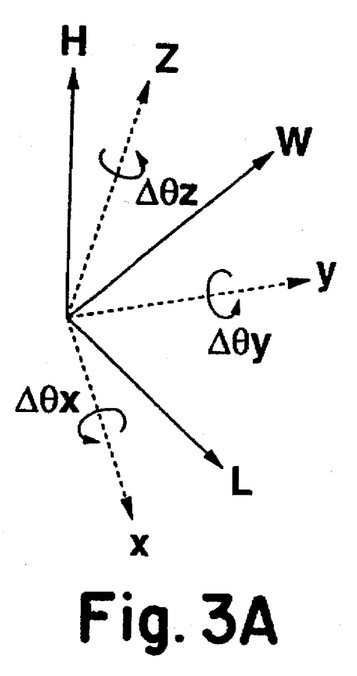
FIG. 3A and FIG. 3B are illustrations for explaining an operation for converting a mount setting angle into a direction cosine.
Figure 3B:
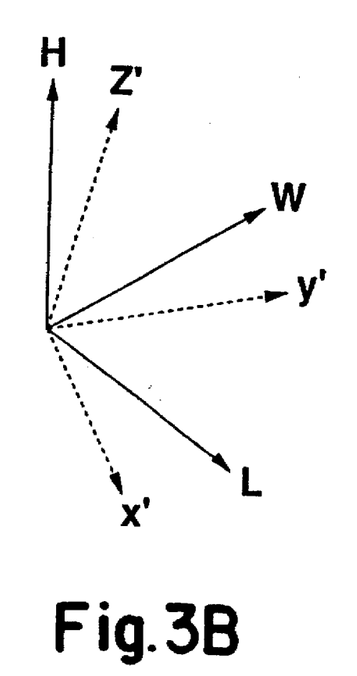

Then, the mount setting angle read as described above is converted into a direction cosine. That is, when the mount setting angle is set and calculation is made in the form of xyz coordinates, the number of calculations required noticeably increases. Therefore, the main axis of the mount is changed according to the mount setting angle to simplify the subsequent calculation. That is, the changed mount setting angle is calculated according to direction cosine by using the changes ($\Delta\theta x$, $\Delta\theta y$, and $\Delta\theta z$) of the mount setting angles in three axial directions on the x, y, and z axes as shown in FIG. 3A. In FIG. 3, L is the length direction of a vehicle, W is the width direction of it, and H is the height direction of it. The mount setting angle is calculated according to the direction cosine for L, W, and H. As shown in FIG. 3B, the main axis of the mount after the design variable is changed is assumed as x', y', and z'. The mount position, spring constant, and damping coefficient after the main axis is changed are held.

S8

Figure 4:
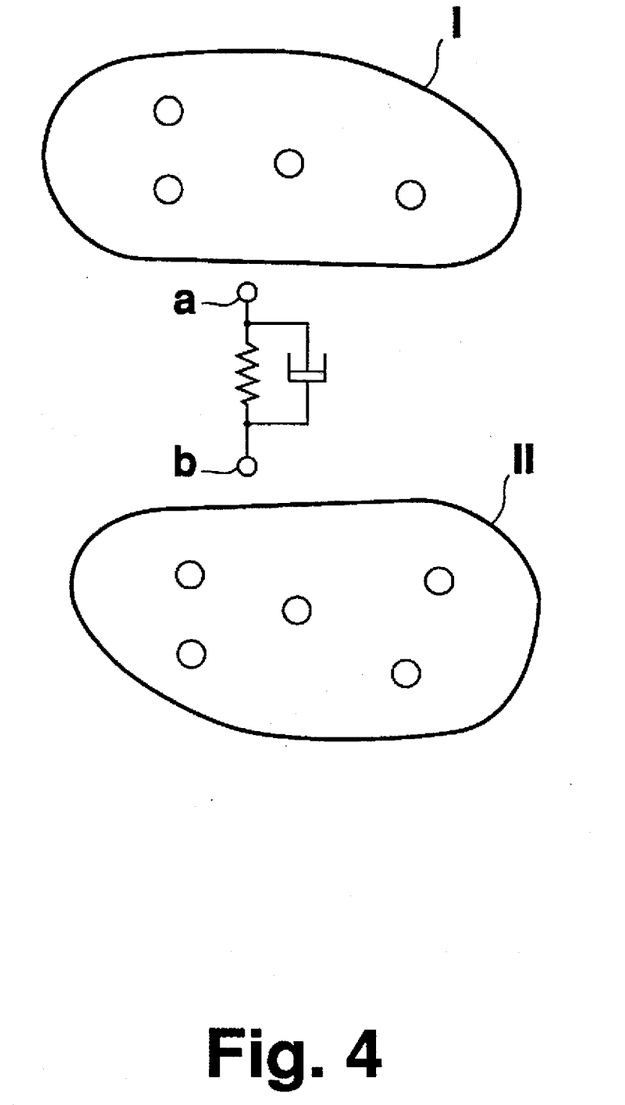
FIG. 4 is an illustration for explaining the calculation of an eigenvector of a setting position.

Then, the eigenvector at the setting position after three axes are changed is calculated. Thereby, the angle of the analysis model is corrected. In this case, connection between a setting object I (e.g., engine) and a setting object II (e.g., body) by a mount is considered. As shown in FIG. 4, a mount grid (setting point) at the side of the mount setting object I is assumed as "a" and a grid at the side of the setting object II is assumed as "b". Then, as shown in FIG. 4, a grid nearest to the mount grid "a" at the side of the setting object I is located. When assuming the grid as "a'", the eigenvector of "a" can be calculated from the eigenvector of "a'". That is, the eigenvector of "a" can be calculated by extending the arm of an object (rigid body) from "a'" to "a". Similarly, the eigenvector of "b" can be calculated.

Such types of analysis concerning grids and eigenvectors is well known. See, for example, U.S. Pat. No. 5,165,015 to Yokota with regard to such eigenvector analysis and specifically FIG. 9 and column 2, lines 40–65 with regard to grid modeling.

Moreover, the eigenvector is recalculated according to the mount setting angle. That is, the eigenvectors of the setting points "a" and "b" are converted from the LWH coordinate system of the x', y' and z' coordinate system. Because this conversion is made only for necessary grids, eigenvectors of the mount setting points in the analysis model are recalculated and unnecessary grids are omitted.

S9

The state in which a changed mount (however, initial mount is used when the number of repetitions is 0) is set to the analysis model made in S8 is complex-eigenvalue-analyzed. Modal parameters (e.g., eigenvalue, eigenvector, and mode damping ratio) can be obtained from the complex eigenvalue analysis. In this case, because n-mode data is obtained when the analysis result shows linear viscous damping and 2n-mode data is obtained when it shows general viscous damping, the data are held. For the n-mode, subsequent calculation requires only a little time. However, as a lot of time can be used for the calculation, it is possible to hold all of the 2n-mode data.

S10

Response levels under the condition specified in S2 (h) are calculated according to the modal parameters obtained in S9. That is, transmission force is calculated when it is designated and acceleration is calculated when it is designated. Then, peaks are selected among the response levels thus obtained. That is, as shown in FIG. 5, peaks are selected in the range of $\Delta P$ starting with the highest level according to the selection level ($\Delta P$ in FIG. 5) designated in S2 (i) and S2 (j). The peak selection is carried out for each phenomenon.

The selected number of peaks is sorted into objective and restrictive functions and further sorted so that the number of peaks is smaller than a certain value (e.g., 10). Thus, by decreasing the number of peaks, it is possible to decrease the time required for the optimizing calculation and the memory capacity. Moreover, the most dissatisfactory objective function is calculated.

The dissatisfaction degree "t" of an objective function is shown by the following expression:

$$t=(f-fu)/(fa-fu)$$

wherein "f" represents a peak level, "fa" represents a target level, and "fu" represents an ideal level.

The dissatisfaction degree "t" of a restrictive function is shown by the following expression:

$$t=(g-gl)\cdot gs$$

wherein "g" represents a peak level, "gl" represents upper and lower limits, and "gs" represents "1" or "−1".

The dissatisfaction degree "t" is calculated for the peaks thus selected to decrease the number of peaks up to a predetermined value.

S11

Then, the sensitivity for each peak level (selected in S10) is calculated for every phenomenon of the data (position, inclination, spring constant, and damping coefficient) of each mount. In this case, the sensitivity calculation is analytically carried out for each of the above four pieces of data.

First, in the optimizing calculation, the frequency response of vibration is calculated by using the above modal parameters. The expression for calculating a frequency response amplitude is shown as follows:

$$Dp=\Sigma(\psi r1 \cdot \psi rp/(2\pi fj-pr))\cdot fl \qquad (r=1 \text{ to } 2n)$$

wherein the subscript "p" is a response-point ID number, the subscript "1" is an ID number in the excitation point direction, D is a displacement amplitude (complex number), F is an excitation amplitude (complex number), "f" is an excitation frequency (unit: Hz), "j" is an imaginary unit "$\sqrt{-1}$", the subscript "r" is a native mode number, "n" is the number of degrees of freedom, P is an eigenvalue (complex number), and $\psi$ is an eigenvector (complex number).

By using the above expression, the sensitivity Dp' of Dp for any design variable is obtained from the following expression. In this case, the symbol "'" represents a differentiation about a design variable.

$$Dp'=\Sigma(\psi r1'\psi rp+\psi r1\psi rp')/(2\pi fj-Pr))+\psi r1\psi rPr'/(2\pi fj-Pr)^2)f1 \text{ to } 2n)$$

It is found that the sensitivity Dp of a vibration level can be analytically obtained from this expression when the eigenvector sensitivities, r1' and ψrp' and the eigenvalue sensitivity PR' can be analytically obtained from the above-mentioned expression. When Pr' and ψr' are transformed by using xrr and yrr, the following expression is obtained. In this application, a vector is expressed with "{56}" and a matrix is expressed with "[]".

$$Pr'=Prxrr-yrr\{\psi r\}'=\Sigma((Prxsr+ysr)/(Ps-Pf))\cdot[\psi s]-(1/2)\cdot x(s\pi t \text{ to } 2n)$$

Then, the above "x" and "y" can be relatively easily obtained by substituting the conditions according to the equation of motion on each piece of data for the above expression. Therefore, by obtaining the above "x" and "y", sensitivities can be efficiently calculated.

Here, to calculate the sensitivity for the spring constant "k", the following expressions are used:

$$xsr=0, \; ysr=(\psi Es-\psi Bs)(\psi Er-\psi Br)$$

wherein ψE and ψB are eigenvector components of the engine side and body side at the mount setting point. These vectors are components in the direction defined by design variables.

In this case, when assuming the difference between the eigenvectors of the engine and body sides (setting objects) at the mount setting point as Δφ=ψe−ψb, the above expression of "ysr" is expressed as follows:

$$ysr=\Delta\phi s\cdot\Delta\phi r$$

The sensitivity for the damping coefficient C is expressed as follows:

$$ysr=0$$

$$ysr=(\psi Es-\psi Bs)(\psi Er-\psi Br)=\Delta\phi s\cdot\Delta\phi r$$

It is also possible to analytically obtain the sensitivity for the mount main-axis inclination θ and that for the mount position.

S12

Next, it is judged whether a variable S for judging whether an optimum solution converges is 0 or not. The variable S=1 represents that the optimum solution converges and the variable S=0 represents that the optimum solution does not converge.

S13

When the calculation of the optimum solution does not converge, the optimum solution is calculated. Unless an optimum solution is found through the calculation, the operation ends. The optimum calculation is carried out by using the algorithm of the simplex method. Particularly, because the satisfaction trade-off method of the multipurpose mathematical programming is used, the "most dissatisfactory objective function" is calculated in S10.

In this case, the optimization is to obtain {y} for minimizing $\{B\}^T\{y\}$ under the conditions of "{y}≧{0}, $[A]^T\{y\}\geq\{C\}$".

Therefore, the objective function is "$\{B\}^T\{y\}$" and the restriction approaches "{y}≧{0} and $[A]^T\{y\}\geq\{C\}$".

On the other hand, the dissatisfaction degree "ti" on the vibration level Pi (i=1 to NF) serving as the objective function is defined as "ti=(Pi−fu)/(fa−fu)" as described above. Therefore, a representative value of the dissatisfaction degree is assumed as Z(ti−Z)≦0 and the simplex method is used to minimize Z. In this case, the superscript "T" represents transposition.

Moreover, the following are used as restrictions: upper and lower limits of design variable {S2 (a)}, other restrictions {S2 (f) and S2 (c)}, and levels of restrictive function.

S14

Then, restrictions of a design variable are checked. That is, the fluctuation range of the design variable is specified as "BL≦x≦BU" (where, BL is the lower limit of the fluctuation latitude of the design variable "x" and BU is the upper limit of the fluctuation latitude of it) to solve a primary approximate optimum solution. In this case, according to the above restriction, 0<x−BL<BU−BL, and if "y=x−BL" is defined 0<y≦BU−BL.

Then, the optimizing calculation of "y" is carried out to obtain the optimum design variable "x" from "y". The above expressions in the form of a matrix are superimposed on the simplex method.

A case in which the obtained optimum solution "y" is slightly larger than "BU−BL" is called an error.

This error is calculated as $$p=[(y-(BU-BL))/(BU-BL)]\times 100\%$$

and the calculation is stopped when "p" becomes larger than 1%. This is because the reliability of the optimum solution is very small for the above large error and thus, no satisfactory calculation can be carried out even if the optimum solution is used.

On the other hand, when "p" is smaller than 1%, "y" is forcibly replaced with "BU−BL". This is because the calculated value thus obtained can be trusted to a certain extent. In this case, the optimum objective and restrictive functions are used without being replaced. This is because the design variable error of approx. 1% can be adequately used for actual vehicles. By replacing "y" with "BU−BL", X becomes equal to BU. However, this is no problem because the above objective and restrictive functions are recalculated in S10.

The value "1%" is selected for the following reasons.
(a) The calculation error represents two significant digits.
(b) The optimizing calculation can be trusted.
(c) The accuracy is enough for actual vehicles.

Therefore, the value "1%" does not have an absolute meaning. Values of 5% and 0.1% are accepted as long as they meet the above conditions (a) to (c).

S15

Then, it is judged whether the optimum solution converges (S15). In this case, if the fluctuation value of all design variables is much smaller than the move limit, it is judged that the optimum solution converges. That is, if the optimum solution is changed in repetitive calculation and its movement is very small, it is estimated that the movement of the optimum solution is very small through subsequent repetitive calculation and it is judged that the optimum solution converges. In this case, the judgment for a very small movement is assumed as (move limit)×0.5.

S16 to S18

When it is judged in S15 that the optimum solution converges, S is assumed as "1" (S18). When it is judged that the optimum solution does not converge, S is assumed as "0" (S17) and the operation is restarted with newly calculated values at step S7. In any case, levels and level sensitivities are recalculated for each phenomenon. In the case of the repetitive calculation, the move limit value or the like is changed so that the solution converges. Means are provided for inputting the new values at step S7. When S is assumed as "1" in S18, the answer comes to N in the above S12. In this case, calculation results are outputted (S18) because the solution converges. The calculation results are outputted to the file specified in S1 (i). Means are provided for such output. The output contents are as shown below.

(a) Optimizing repetitive transition output

The following items are outputted: number of total steps, discrimination of convergence from truncation due to limitation of times, transition of objective- and restrictive-function levels (peak level, frequency), transition of design variables, and transition of move limit.

(b) File to be read at restart

Data values the same as those described in S6 are written in this process.

(c) Output of mount data at end of calculation (Value of design variable and direction cosine of mount main axis are outputted).

(d) Sensitivity for each phenomenon according to each design variable at end of calculation The value of each design variable, sensitivity for each peak level of each phenomenon, peak levels, and frequencies are outputted. Thus, the calculation results in the optimizing calculation are outputted.

For this embodiment, it is judged whether an error value is kept within a predetermined range (1%) or not in checking the design variable restrictions in S14. When it is kept within 1%, an optimum solution is corrected to the upper or lower limit of a restriction and calculation is continued with all other restrictions held. Thereby, it is possible to prevent a solution from diverging in repetitive calculation even if the solution differs due to an error caused by the number of significant digits in the optimizing calculation. Therefore, it is possible to improve the calculation efficiency while maintaining the optimizing calculation accuracy.

Figure 6:
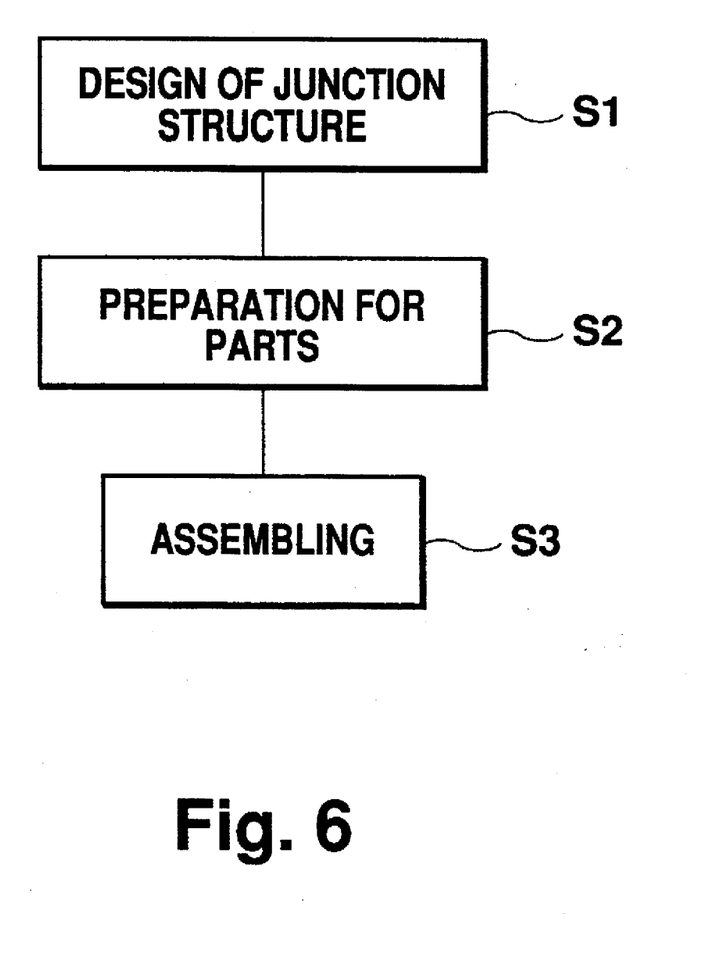
FIG. 6 is a flow chart showing the manufacturing method of the present invention.

Moreover, the present invention makes it possible to determine the position, angle, spring constant, and damping coefficient of a mount made of an elastic material such as rubber or plastic when securing an engine, differential gear unit, and muffler to an automobile body through the mount. Therefore, the present invention makes it possible to provide a method for efficiently manufacturing an automobile. That is, as shown in FIG. 6, a junction structure including the setting position, setting angle, spring constant, and damping coefficient of the mount is first calculated according to the above method (S1). Then, a plurality of parts to be set are prepared (S2). For example, a body, an engine to be set to the body, and a mount having the calculated spring constant and damping coefficient are prepared (S2). And, assembling is done by using the parts thus prepared (S2). In this case, the position and angle of the mount are determined according to the data obtained from the above calculation. Thus, assembling can be done with a plurality of parts. Thereby, assembling can be done so that vibration during idling of the engine is least conveyed to a driver. Usually, an end product can be manufactured by carrying out various operations after the above operation.

Thus, an automobile can be efficiently manufactured by using the position, angle, spring constant, and damping coefficient of the mount obtained from the above calculation. Moreover, the present invention makes it possible to efficiently calculate the position, angle, spring constant, and damping coefficient of a mount in assembling various parts as well as manufacturing of an automobile. Therefore, efficient manufacturing can be achieved.

What is claimed is:

1. A method for manufacturing a product by using an analysis model of a structure including a plurality of elements including transforming values of design variables into an optimum solution of design variables of a junction structure between said plurality of elements, comprising:

an eigenvalue analyzing step for setting design variables of the junction structure to predetermined values and calculating an eigenvalue and eigenvector of the junction structure for a predetermined phenomenon;

a response calculating step for calculating a response of the analysis model for the predetermined phenomenon by using the eigenvalue and eigenvector;

a sensitivity calculating step for calculating a sensitivity of the calculated response for each design variable;

an optimum solution calculating step for calculating an optimum solution of values of said design variables for an analysis model;

a restriction checking step for checking if said values meet one or more restrictions;

an optimum solution changing step for changing the value of at least one design variable of the optimum solution to a value meeting said one or more restrictions when a judgment result checked in the restriction checking step is in violation of one or more of said restrictions and the violation is in a predetermined small range;

an updating step for inputting values of said design variables from said optimum solution calculating step and said optimum solution changing step as updated values in the eigenvalue analyzing step;

a step for outputting updated values of said design variables when a response calculated by the response calculating step approaches a predetermined value; and a step for determining a junction structure according to the outputted values of said design variables of an optimum solution thus obtained and manufacturing a product in accordance with said outputted values by combining a plurality of parts.

2. A method according to claim 1, wherein the eigenvalue analyzing step sets said design variables for a junction structure joining two parts through a mount made of an elastic material.

3. An optimum design system for transforming values of design variables into values of an optimum solution of design variables of a junction structure between a plurality of elements by using an analysis model of the junction structure including said plurality of elements, comprising:

eigenvalue analyzing means for setting design variables of the junction structure to predetermined values and calculating an eigenvalue and eigenvector of the junction structure for a predetermined phenomenon;

calculating means for calculating a response of an element of the junction structure;

sensitivity calculating means for calculating a sensitivity of a calculated response for each design variable;

optimum solution calculating means for calculating an optimum solution of values of said design variables for an analysis model;

restriction checking means for checking if said values meet one or more restrictions;

optimum solution changing means for changing the value of at least one design variable to a value meeting said one or more restrictions when a judgment result checked by the restriction checking means is in violation of one or more of said restrictions and the violation is in a predetermined small range;

means for inputting values of said design variables from said optimum solution calculating means and from said optimum solution changing means as updated values in the eigenvalue analyzing means;

means for outputting updated values of said design variables as an optimum solution of the design variables when the calculated response approaches a predetermined value; and means for determining a junction structure according to the outputted values and manufacturing a product in accordance with said outputted values by combining a plurality of parts.

4. An optimum design system for transforming values of design variables of an automobile structure into values of an optimum solution of design variables of the automobile structure of a junction structure between a plurality of elements by using an analysis model of the junction structure including said plurality of elements, comprising:

eigenvalue analyzing means for setting design variables of the automobile structure of the junction structure to predetermined values and calculating an eigenvalue and eigenvector of the junction structure for a predetermined phenomenon;

calculating means for calculating a response of an element of the junction structure;

sensitivity calculating means for calculating a sensitivity of a calculated response for each design variable of the automobile structure;

optimum solution calculating means for calculating an optimum solution of values of said design variables of the automobile structure for an analysis model;

restriction checking means for checking if said values meet one or more restrictions;

optimum solution changing means for changing the value of at least one design variable of the automobile structure to a value meeting said one or more restrictions when a judgment result checked by the restriction checking means is in violation of one or more of said restrictions and the violation is in a predetermined small range;

means for inputting values of said design variables of the automobile structure from said optimum solution calculating means and from said optimum solution changing means as updated values in the eigenvalue analyzing means; and means for outputting updated values of said design variables of the automobile structure as an optimum solution of the design variables of the automobile structure when the calculated response approaches a predetermined value.

5. An optimum design system according to claim 1, wherein the optimum solution calculating means obtains an optimum solution by operating on a first design variable y defined as the difference between a second design variable x and a lower limit BL of the second design variable x.

6. An optimum design system according to claim 5, wherein the optimum solution changing means determines a violation of a restriction when y>(BU−BL), where BU is an upper limit of said second design variable x.

7. An optimum design system according to claim 5, wherein the second design variable x is set equal to BU when a violation of a restriction is in a predetermined small range.

8. An optimum design system according to claim 7, wherein the judgment result is satisfied when the quantity x 100% is 1% or less.

9. An optimum design system according to claim 4, wherein the sensitivity calculating means analytically calculates a sensitivity of each design variable by solving a differential equation obtained by differentiating a relational expression of eigenvalue and eigenvector based on a equation of motion of a free vibration system with each design variable.

10. An optimum design system according to claim 4, wherein the eigenvalue analyzing means is for setting design variables of a junction structure joining two parts through a mount made of an elastic material, and one of said design variables is a position of the mount.

11. An optimum design system according to claim 4, further comprising:

means for converting the design variables of the optimum solution output by the outputting means into measurements of elements of the automobile structure; and means for storing the measurements for use in a process of manufacturing an automobile.

* * * * *